US006762966B1

United States Patent
LaRosa et al.

(10) Patent No.: US 6,762,966 B1
(45) Date of Patent: Jul. 13, 2004

(54) METHOD AND CIRCUIT TO INVESTIGATE CHARGE TRANSFER ARRAY TRANSISTOR CHARACTERISTICS AND AGING UNDER REALISTIC STRESS AND ITS IMPLEMENTATION TO DRAM MOSFET ARRAY TRANSISTOR

(75) Inventors: Giuseppe LaRosa, Fishkill, NY (US); Alvin W. Strong, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/338,928

(22) Filed: Jan. 8, 2003

(51) Int. Cl.[7] .............................................. G11C 29/00
(52) U.S. Cl. ....................................... 365/201; 365/149
(58) Field of Search ................................. 365/201, 149

(56) References Cited

U.S. PATENT DOCUMENTS 6,055,200 A * 4/2000 Choi et al. .................. 365/201

2003/0229832 A1 * 12/2003 Cioaca ....................... 714/724

* cited by examiner

*Primary Examiner*—Huan Hoang
(74) *Attorney, Agent, or Firm*—Eugene Shkurko; H. Daniel Schnurmann

(57) ABSTRACT

An on-chip circuit and testing method to quantify a transistor charge transfer performance and charge retention capability of a DRAM cell in a realistic operational environment is described. The method and circuit can be extended to evaluate aging of the cell transfer device due to MOSFET wearout mechanisms that become activate during the charge transfer as well as during storage under operating or burn-in conditions. The on-chip circuit forces and senses a voltage to an individual DRAM storage capacitor allowing the pulse test methodology characterize the individual storage capacitor charge leakage rate and quantify the rate of charge transfer between the bitline and the storage capacitor in the DRAM cell.

17 Claims, 15 Drawing Sheets

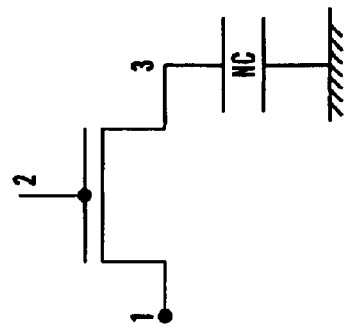
FIG. 1C
PRIOR ART
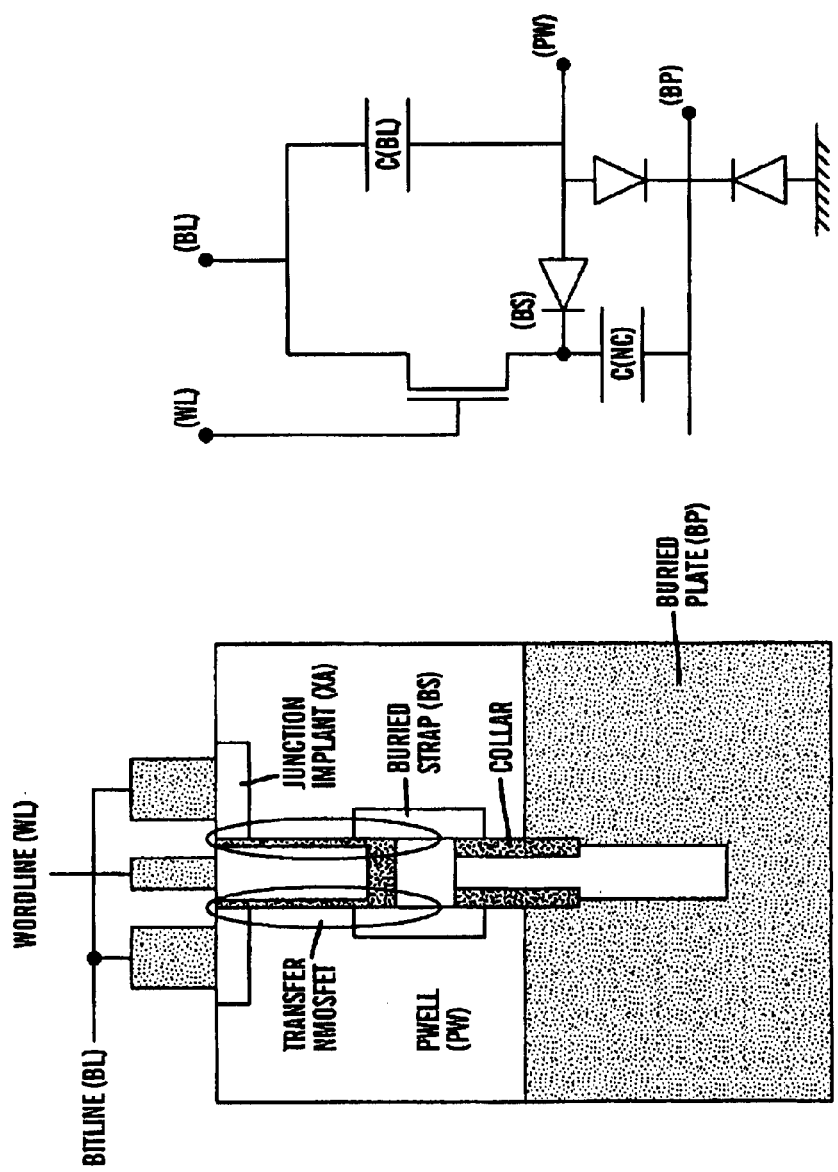
FIG. 1B
PRIOR ART
FIG. 1A
PRIOR ART

METHOD AND CIRCUIT TO INVESTIGATE CHARGE TRANSFER ARRAY TRANSISTOR CHARACTERISTICS AND AGING UNDER REALISTIC STRESS AND ITS IMPLEMENTATION TO DRAM MOSFET ARRAY TRANSISTOR

BACKGROUND OF THE INVENTION

1. Technical Field of the Invention

This invention pertains to random access memory cells. In particular, this invention pertains to testing the performance characteristics of individual memory cells, thereby providing specific performance data typically unavailable in mass integration testing schemes.

2. Description of the Prior Art

The building block of today's high-density DRAM chips is one provided with a single transistor cell. FIG. 1A shows the design of a conventional DRAM cell that uses a trench as Node Capacitor (NC) and a vertical NMOSFET, as the transfer device. In this design, XA and Buried Strap (BS) junctions and the vertical gate oxide formed along the top trench make up the vertical transfer device. The gate oxide is controlled by Word Line (WL), while Bit Line (BL) is used to transfer charge to NC. The charge transfer between Bit Line (BL) and NC occurs by inverting the channel of the transfer device (WL high) and adequately biasing BL (V(BL)>0). In this case, a logic 1 is stored in NC by transferring electrons from NC to BL, while a 0 is stored by transferring electrons from BL to NC. The 1 or 0 status is maintained in the storage capacitor by accumulating the channel (WL low). The DRAM cell is isolated by conveniently biasing PWELL (PW) and buried plate (BP). FIG. 1B illustrates a circuit schematic of the DRAM cell shown in FIG. 1A. A key feature of this structure is that the BS junction is directly connected to NC and is not directly addressable.

A careful evaluation of the transfer and retention of charge capabilities is critical in the early phases of the cell development. Typically, this is achieved by circuit simulation. HCspice DC Array device models are, for example, developed from measuring the. DC Array device parameters, using them to characterize the storage and transient characteristics of the cell. These simulations are confirmed later when a product is available for testing. This approach has two inherent problems: 1) appropriate structures need to be designed for a direct probing of BS and DC characterization of the transfer device, and 2) the product test may come too late in the cell development, making it very difficult to (retroactively) optimize the cell design. It is desirable to test different cell designs, and readjust parameters of the cell, such as trench parameters, buried strap engineering, implants, oxide thickness, etc., at given voltages and temperatures.

One of the problems that exists in memory cell development during qualification activities for any trench based DRAM, is that it is not easy to stress the arrays in a real world memory environment. Most of the work that is done is at production level (burn-in, etc.). Burn-in is where, for example, a 250 megabit memory is provided and 250 million cells are exercised altogether. By doing so, certain circuit parameters, such as retention time and the like are tracked, particularly those that somehow are indirectly related to the actual cell operation. However, there is no previously known way to directly stress a cell with controlled inputs and sense the response of the single device cell in a real environment.

Today, memory technologies develop the design on the production level, i.e., with millions of cells exercised by a process diagnostic monitor, by stressing them altogether. The array device features and sensitivities are thereby quantified indirectly. The present invention allows testing and stressing of the array device and cell to be performed directly rather than on a mass integration level.

Further, no method has been previously developed to directly measure the transfer and storage of charge in a realistic structure without a recurring product test. The prior art does not provide a circuit for directly measuring charge transfer/retention characteristics in DRAM one transistor cells. Neither does the prior art solve the problem on how to run key device DC reliability stresses on particular production cell structures and establish their impact on EOL (End of Life) projections.

The present invention provides a circuit that fundamentally probes a device in a network (directly stress) and senses the charge transfer characteristics. Eventually, each of the 250 million cells can be tested, as mentioned in the example above, but herein a direct link to one or a group of devices must be established. By selecting the bitline and wordline for each, one can run a product stress and investigate a single cell fail. It is now possible to electrically sense a single cell by focusing directly on the cell to stress it. Finally, one can also characterize the device of any cell in any environment to see if weak cells are present.

By exercising a DRAM cell device with a known time within which the cell stores a charge, the amount of charge stored, the length of time when most of the charge is retained and voltage is applied, one can generate and use this information by sending pulses to the cell in a way that one can characterize the charge transfer itself. This methodology can be used not only for testing charge transfer characteristics, but also for stressing the cell to perform lifetime wearout modeling.

The DRAM application described hereinafter is an example of how this process and circuit can be applied to characterize any charge transfer device in its production environment.

SUMMARY AND OBJECTS OF THE INVENTION

In a first aspect of the invention, there is provided a DRAM cell as part of an circuit whose basic elements are a MOSFET device connected in series with a capacitor used as a charge transfer device (FIG. 1C). MOSFET junction (3) (equivalent to BS) is connected to the capacitor and is not directly addressable. The charge exchange between capacitor (NC) and junction (1) takes place by modulating gate (2). It is of critical importance to characterize the charge retention and transfer of the capacitor and the MOSFET device, respectively. Since the junction (3) cannot be directly addressable this cannot be achieved by simple DC testing.

In a second aspect of the invention, there is provided a methodology as well as an on-chip circuit for characterizing the charge retention and transfer response of the basic circuit, as illustrated in FIG. 1C, using a realistic test sequence. Although this methodology can be used for this general structure, it will be described by using the vertical DRAM cell (shown in FIG. 1A).

Accordingly, it is an object of the invention to provide a new on-chip circuit and testing methodology that allow quantifying the transistor charge transfer and the NC charge storage capability of a DRAM cell in a realistic field environment.

It is another object of the invention to provide an on-chip circuit that imposes and senses a voltage in an individual DRAM storage capacitor.

It is still another object of the invention to provide a pulse test method to characterize an individual storage capacitor charge leakage rate while the wordline is at low and when a logic 1 is initially stored in the DRAM cell.

It is yet another object of the invention to provide a test method for quantifying the rate of charge transfer between the bitline and the storage capacitor in an individual DRAM cell.

BRIEF DESCRIPTION OF THE DRAWINGS

Other features, aspects and advantages of this invention will become apparent from the following detailed description of the presently preferred embodiment of the invention, when taken in conjunction with the accompanying drawings.

FIG. 1 illustrates a conventional vertical array DRAM cell.

BEST MODE FOR CARRYING OUT THE INVENTION

The characterization of the NC charge storage and transistor charge transfer capabilities of a given DRAM cell are critical elements when optimizing its design. This evaluation cannot be carried out in an actual DRAM cell by constant voltage DC biasing means. In particular, a WL low condition (transfer device is in off channel conduction) does not allow direct DC access to BS.

Another challenge is that the testing device has much higher capacitance than the circuit (about 50 femtofarads in the current example) being tested. Thus, measuring a very small pulse coming out of a very low capacitance is difficult because by the time a measurement is performed, the signal is gone. A voltage amplifier local to the cell, i.e., on-chip, is thus needed. Typically, about 15 femtocoulombs are stored in the cell, hence, 1 volt on a 50 femtofarad cell, (considering handling hundreds of millivolts signal margin), results in a very small total voltage difference between two bitlines.

The on-chip circuit and testing methodology of the present invention quantify the transistor charge transfer and NC charge storage capability of a given DRAM cell in a realistic operation. This methodology can be extended to evaluate the aging of the cell transfer device due to MOSFET wearout mechanisms that can be activated during the charge transfer as well as storage in operation or burn-in conditions.

The application of the circuit and test methodology is not limited to any particular DRAM cell test and stress investigation. The method is advantageously used to stress and test any transfer-to-storage device even when all the terminals are readily accessible to the device. This is highly advantageous because a product-like stress and test can thus be provided.

The following observations highlight the benefits of the inventive apparatus and methodology. The Node Capacitor (NC) has the property of retaining stored charge for a time (Ts.c) during which the NC voltage is kept almost constant when the cell is not addressed (WL low). In the illustrative reference cell (NMOSFET as transfer device), when a logic 1 is written, an NC positive charge is stored when the NC/BS junction is reverse biased. Leakage mechanisms, such as the BS junction leakage, BS GIDL (Gate Induced Drain Leakage), or tunneling through the trench oxide, are activated by BS to PW as well as by the Node to BP voltage. All these mechanisms reduce Ts.c. By applying selected voltage pulses to BL and WL during period T(T<Ts.c), it is possible to set the BS/NC and BL voltages independently. If WL is kept low (the gate is off) during time Ts.c., BS remains mostly at voltage (V(BS)) while BL is independently biased. The BS voltage V(BS) was set previously by transferring charge from BL (apply V(BL)) to NC and by turning on the transfer device (WL high). For V(BL)=V(WL)=Vdd, the voltage at NC is V(BS)=Vdd−Vth, where Vth is the threshold voltage of the transfer device.

Figure 2:
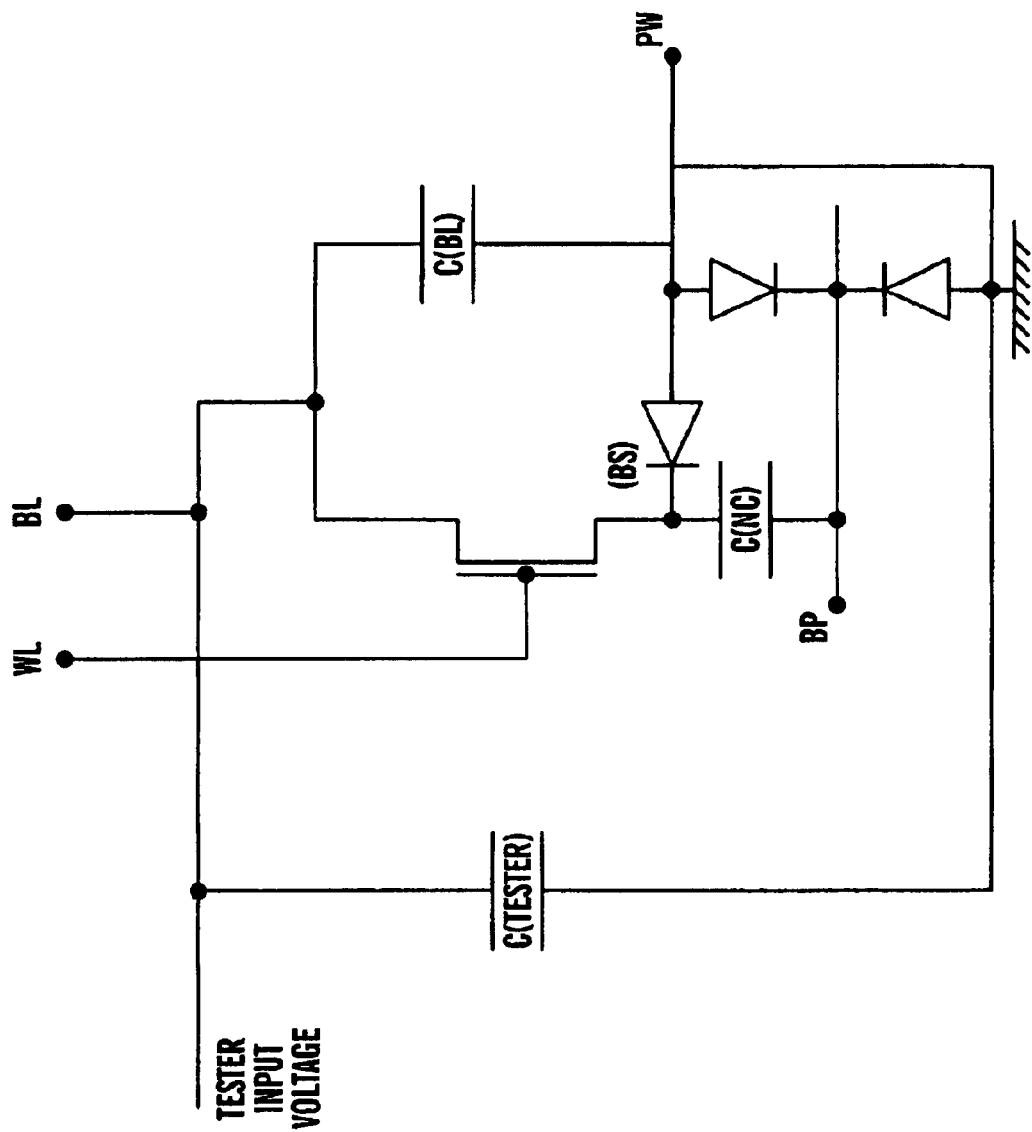
FIG. 2 is a schematic of a typical DRAM cell circuit with tester loading used to illustrate the method of measuring the NC voltage by charge equalization between NC, BL, and the tester capacitance, according to the present invention.

Charge Equalization Between NC, BL, and Tester Capacitance During NC Voltage Measurement Assuming that the load capacitance due to the testing apparatus is C (tester), it can be proven that measuring V(NC) translates into a charge equalization between node (C(NC)), BL (C(BL)) and the tester (C(tester)) capacitance (see FIG. 2). Assuming that C(BL)<<C(NC) and C(tester)>C(NC), the measured Voltage V(EQU) relates to the voltage stored in NC (V(NC)) before the measurement by way of the following Formula 1:

$$V(EQU) = C(NC) \times V(NC)/(C(NC)+C(BL)+C(tester)) \neq (C(NC)/C(tester) \times V(NC))$$

If C(tester)>>C(NC), C(BL)<<C(NC) then V(EQU)<<V(NC).

It follows that:

1) V(EQU) is proportional to V(NC), and the proportionality constant depends on C(BL), C(NC), and C(tester). The rate of change of V(NC) is estimated by measuring V(EQU) as a function of time.

2) V(EQU) value is very small if C(tester)>>C(NC). Typical trench node capacitance is on the order of 40–50 fF, while C(tester) are on the order of pF. With C(tester)>>C(NC), the measured voltage (V(EQU)) may be lower than the tester noise and, as a result, is not measurable. Minimizing C(tester) relative to C(NC) and amplifying the V(EQU) signal allows to measure V(EQU) proportional to V(NC).

Independently Using the BL as a Vehicle to Apply and Sense Voltage on the NC (V(NC)=V(BS))

The DRAM cell (or any structure as shown in FIG. 1C) can be considered a two terminal (WL and BL terminals)

device structure. Since the WL is used to activate the charge transfer between BL and NC by the transfer device, BL is the only terminal to be used to apply and sense a voltage to NC. Therefore, there is provided an on-chip circuit that allows a user to impose and sense a voltage in NC as well as evaluate the transfer device characteristics in a realistic operational environment.

Figure 3:
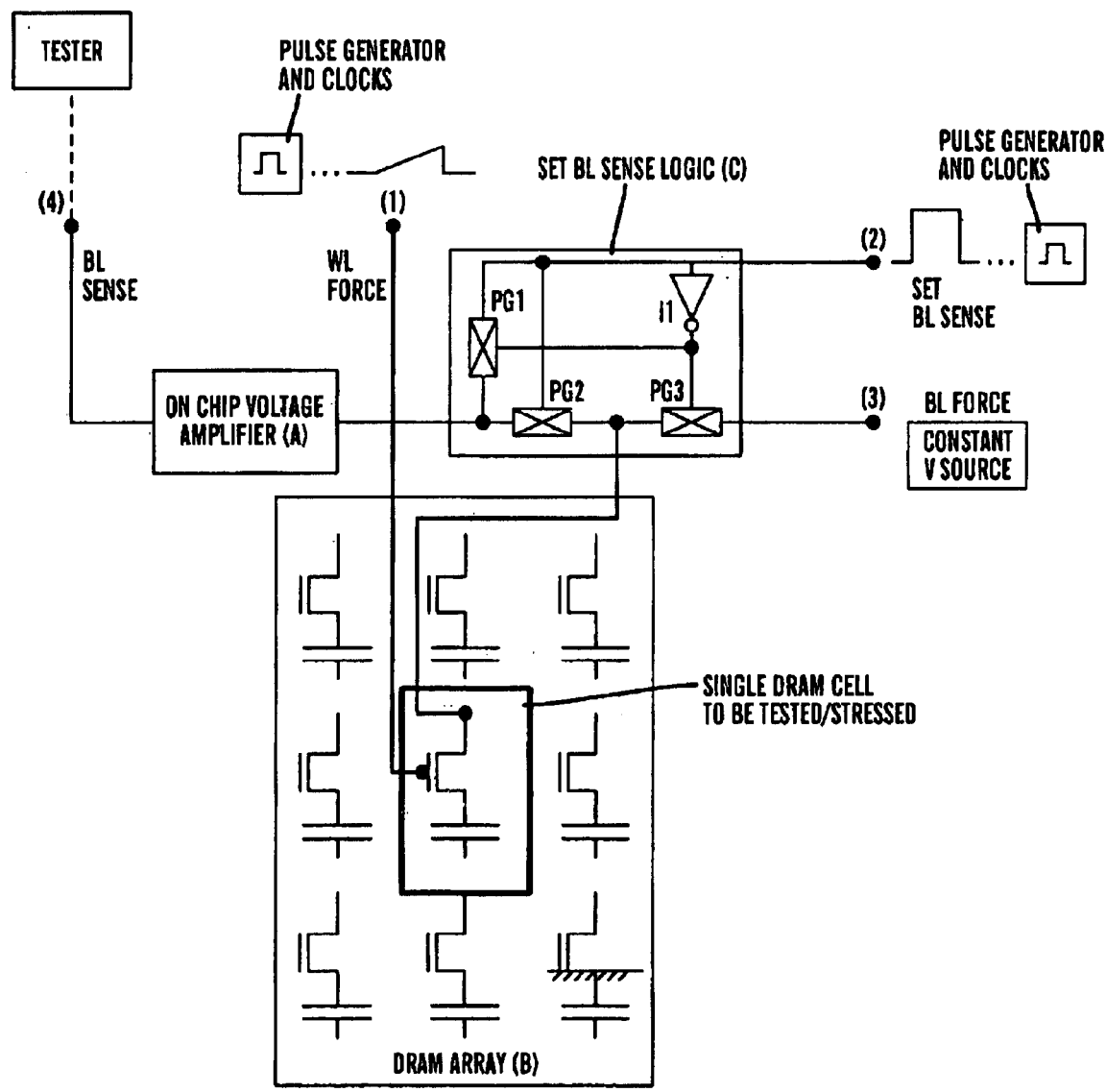
FIG. 3 illustrates a schematic of the circuit used to monitor the charge retention and transfer to a DRAM cell, according to the invention.

FIG. 3 shows the main features of a DRAM cell. This circuit has three main components:

1) an on-chip voltage amplifier (A);
2) a DRAM array (B) wherein only one cell is directly addressed by modulating a WL (1) and BL (3); and
3) a SET BL SENSE logic (C).

The circuit includes three passgates and an inverter that allows, by selectively activating the passgates, to open and close WL and BL to transfer charge. The voltage amplifier is needed to amplify the signal out from the cell to the tester. The voltage amp does not change the shape of the pulse (it scales linearly), but it provides enough signal amplification so that it can be measured. There is no sense amp in the present embodiment which includes two circuits connected to the cell, and which allows testing to be performed. In a typical sense amp in a DRAM environment, the sense amp looks at the reference BL and the actual BL signals using a bistable circuit (which amplifies the signal by outputting a logic 1 when the voltage reaches a certain threshold).

The invention further provides a set of circuits coupled to the cell where the charge transfer (Vt) is directly sensed in a particular cell, which is sensed (tested) at the bitline.

A multiplexer (not shown) can be advantageously used together with the circuit of FIG. 3 to step through many cells, one at a time. A Set BL Sense Logic circuit and voltage amplifier circuit are needed for each tested cell. (Note: they do not need to be part of the memory cell, i.e., the BL sense and voltage amplifies can be placed on the chip, but external to the memory area). A variation thereof uses the circuit as a design device monitor/optimization tool, to be nested within every 20 to 30 memory cells for testing charge transfer characteristics. The circuit can be built on-chip to track the characteristics of the device and be used as an inline monitor.

The DRAM cell to be tested and stressed is part of a DRAM array is designed such that C(BL)<<C(NC). This can be accomplished by ensuring that it is the only cell contacted by WL (1) and BL (3) busses associated therewith. Thus, no other cell in the array is contacted by its WL and BL to ascertain that C(BL)<<C(NC) and that the V(EQU) reduction due to C(BL) is minimized. In addition, by having array cells connected to the same WL and BL, all the cells will be tested concurrently. This prevents having detailed information on a single cell Nesting of the testable cell is needed to ensure that the cell under investigation is part of a product like environment.

SET BL SENSE circuit consists of three passgates PG1, PG2, PG3 and an inverter I1. This circuit has two main functions:

a) to isolate the DRAM cell from the testing apparatus when voltage is applied to NC at BL FORCE node (3). This is achieved by setting SET-BL SENSE LOGIC Low at node (2). At the same time, PG1 allows setting a voltmeter at Set BL Sense Low; and
b) to measure the voltage stored in NC by charge equalization by setting SET-BL SENSE High at node (2). The passgates and inverter devices are designed to minimize their contribution to junction leakage and series resistance with respect to the transfer device.

The Set BL Sense Logic operates as follows. By activating Set BL Sense—sending the pulse (FIG. 3) to node (2), and by applying a pulse (WL force) on WL, charge is transferred to the cell capacitor. There is one node that is used for forcing and sensing, namely, BL out. The passgates with an inverter are arranged so that when one is forcing, one is not sensing, and vice versa. When node (2) is at high, PG3 turns to low (through the inverter) as does PG1 (PG2 switches to high). Then, the tester senses the voltage because the path from the cell through PG2 is open. When node (2) switches to low, PG3 opens and PG2 is off, the path from node (3) to the cell is open such that one can force node (3). The on-chip voltage amp remains on and does not require to be open or closed. Thus, it does not interfere with testing because it is totally disconnected by PG2 being off during test. Such an on-chip voltage amplifier is well know in the art and will not be further discussed herein.

The on-chip voltage amplifier is connected in series to BL sense circuit to amplify the Node Capacitor Voltage V(EQU) signal. The voltage amplifier should have a sufficiently high gain to allow measuring a reasonable voltage. During testistress operations, the BL Force Voltage is set constant at node (3). During testing Set BL Sense as well as WL, voltages are pulsed respectively at nodes (2) and (1). The voltage at NC is monitored by measuring V(EQU) at node (4). When stressed, Set BL Force Voltage is low, so that the cell under stress is isolated from the testing equipment.

The action of forcing and sensing a voltage on NC is not restricted by the use of the inventive circuit. The invention extends to other possible circuit designs that satisfy the above required NC voltage forcing and sensing functions.

Using the proposed on-chip circuit allows to quantify Ts.c (TEST 1) and the transistor cell charge transfer capabilities, when T(WL Low)<<Ts.c (TEST2). This is done, for instance, for the DRAM array described in FIG. 3, and can be easily extended to an equivalent charge transfer MOSFET in series with a storage capacitor circuit.

Figure 4:
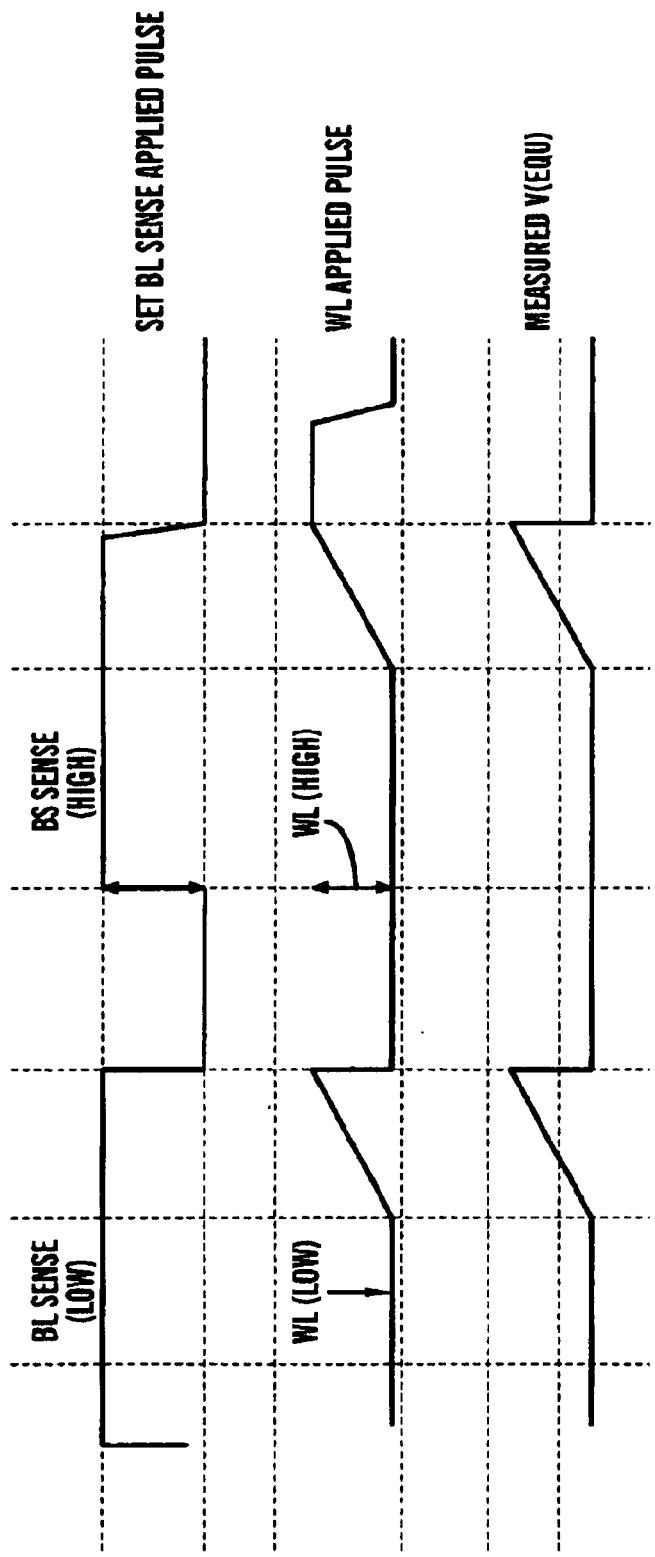
FIG. 4 illustrates pulse stress/test parameter definitions.

With reference to FIG. 4, some definitions for the applied BL and WL pulsed stress/test as well as the induced BS pulse parameters are provided. When the transfer device is on, the BS and BL voltages are equalized. The equalization takes place by transfer of charge between BS and BL. The BS and BL voltages can be independently set when the transfer device is off (T(WL Low)<<Ts.c.).

TEST 1

V(EQU) Measurement after "WL Low" Delay and Corresponding Ts.c Estimate

When a logic 1 is written into the DRAM cell, positive charge is stored on NC. When WL is set low (channel in accumulation), charge can leak out into the well. The rate of NC charge retention depends on the leakage mechanisms that are activated at the applied BS voltage and temperature. In order to optimize the WL and BL pulse waveforms required for testing/stressing the DRAM cell, it is important to characterize the charge leakage rate when a logic 1 is stored in the cell while WL is low. In particular, the time constant Ts.c during which the charge is stored in the NC is critical for keeping the BS and NC voltage almost constant.

The invention provides further a BL and WL pulse test methodology, based on the circuit described in FIG. 3, that allows characterizing the NC charge leakage rate while WL is low, when a logic 1 is initially stored in the cell.

Figure 5:
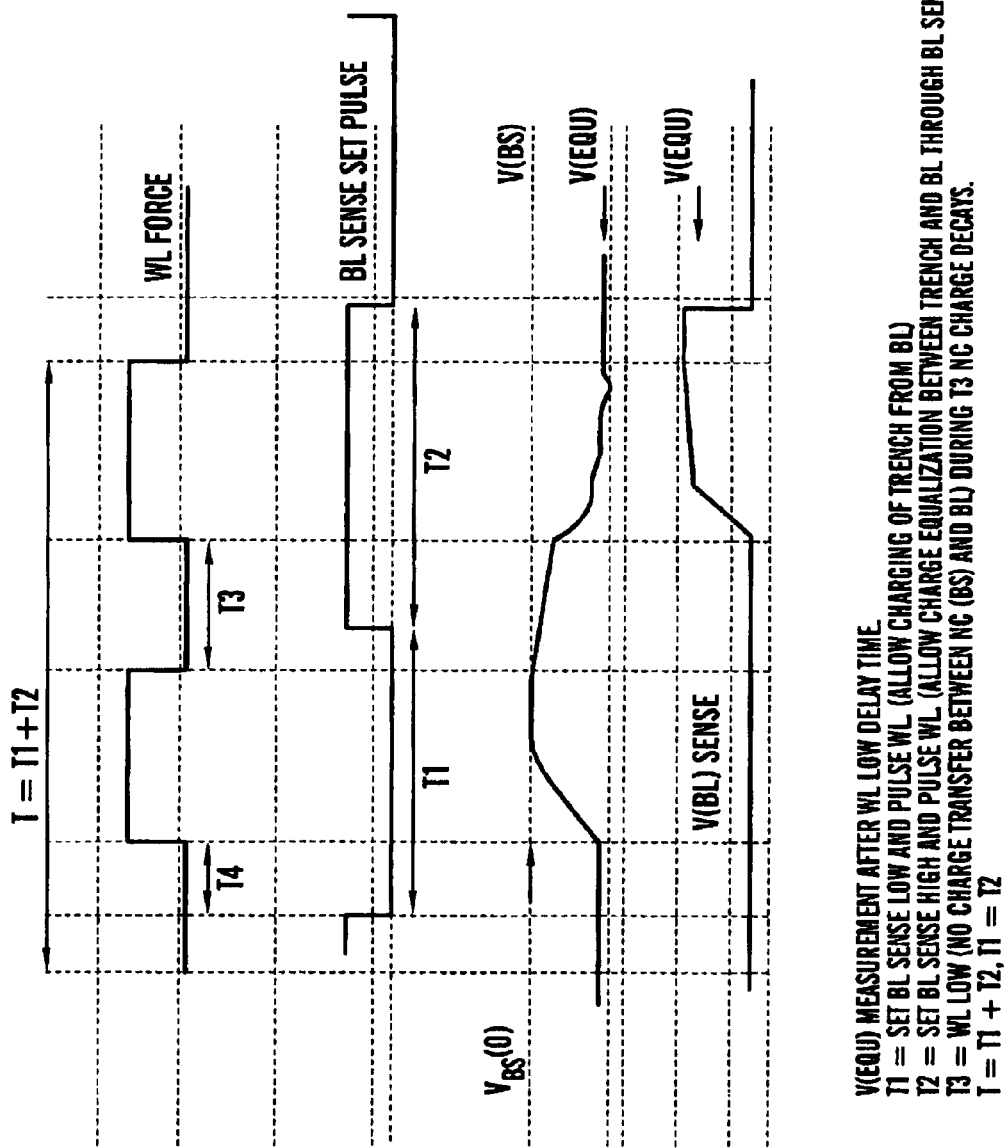
FIG. 5 illustrates V(EQU) measurement after a (WL low) delay time.

With reference to FIG. 5, a constant voltage (V(BL)) is applied on BL Force node. A square pulse with period T is applied to SET-BL Sense circuit. During half-period (T1), the SET-BL Sense Voltage is at low, allowing a possible charge transfer from BL to NC without measurement. During T2, SET-BL SENSE voltage is set high so V(EQU) can be measured. According to Formula 1:

$$V(EQU)=V(NC)*C(NC)/C(\text{tester}).$$

For simplicity, the case T1=T2, T=T1+T2 will be treated. A WL square pulse of period T1=T2 is applied and delayed with respect to SET BL SENSE pulse by T4. During time T3, WL voltage is low and no charge transfer between NC and BL occurs. When WL is high and SET-BL Sense is low, charge transfer takes place from BL to NC. When WL and SET-BL SENSE are both at high, the charge is transferred from NC through BL to the tester, wherein V(EQU) is measured. During T3 (WL Low), the charge in NC can leak out. The value of measured V(EQU) depends on the voltage applied to NC when the charge is transferred to the node and the duration of T3. In particular, the longer T3, the lower V(EQU), when it is measured. Obviously, a maximum value of V(EQU) is obtained when T(WL Low)=0. By increasing T(WL Low), V(EQU) decreases.

Figure 6C:
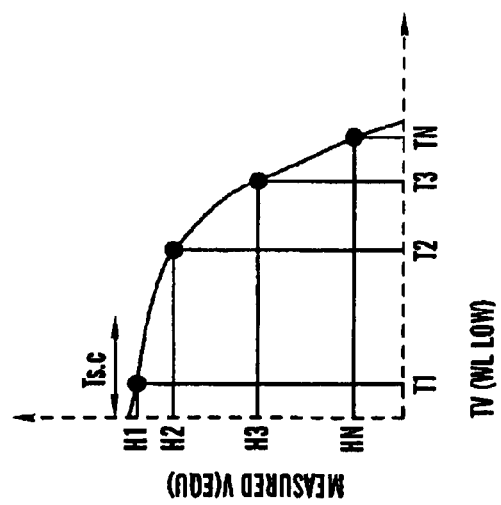
FIG. 6 illustrates measuring the NC charge storage time at a given voltage and temperature.
Figure 6B:
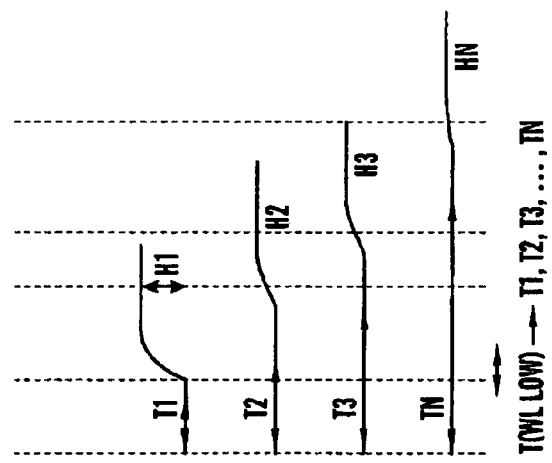
Figure 6A:
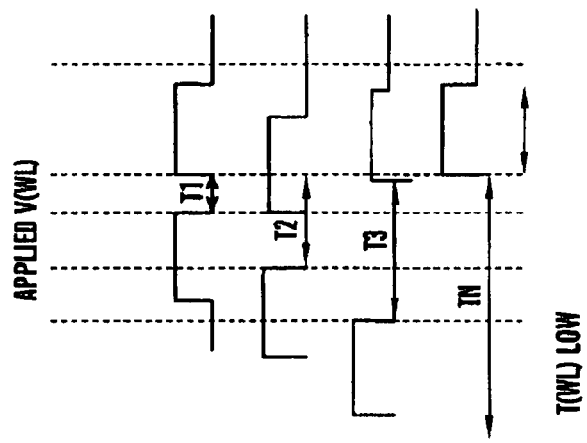

With reference to FIGS. 6, 6A and 6B, there is shown the applied WL pulse with different WL low times T1, T2, T3, ..., TN, and corresponding V(EQU) values H1, H2, H3, ..., HN, when the same V(BL) is applied. FIG. 6C shows a possible dependence of V(EQU) on T(WL Low) for the same V(BL). The value of V(EQU) for the same T(WL Low) strongly depends on the NC charge leakage mechanisms activated by the voltage being applied to the BS reverse biased junction and by the temperature. Other mechanisms listed herein are expected to dominate at different bias conditions. During the time when V(EQU) is almost constant, Ts.c is expected to decrease with an increasing V(BS). FIG. 6C allows the estimate of Ts.c once a given V(EQU) decrease is given.

Figure 7A:
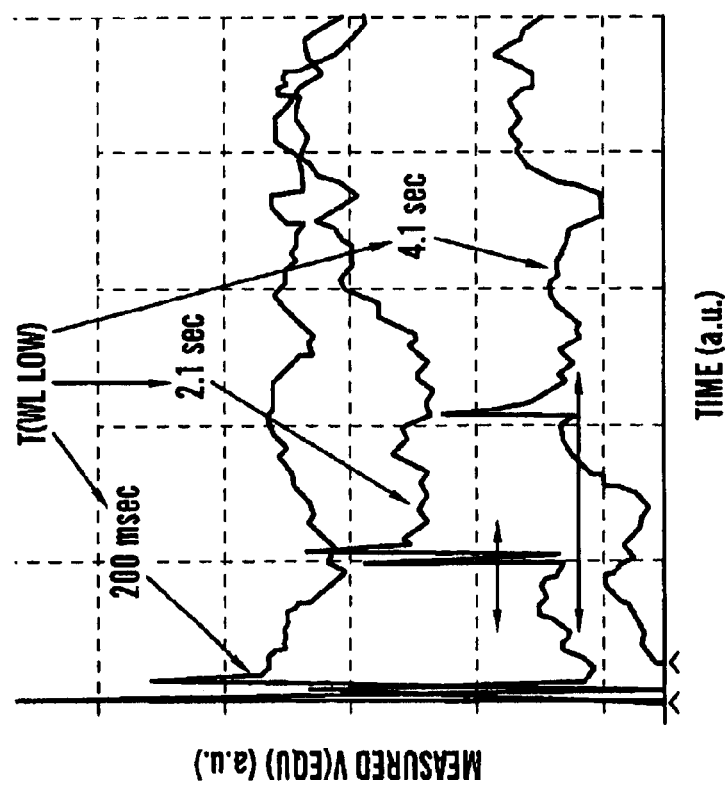
FIG. 7 illustrates the measured V(EQU) as a function of T(WL Low), showing that the height of the pulse V(EQU) decreases when T(WL Low) increases.
Figure 7B:
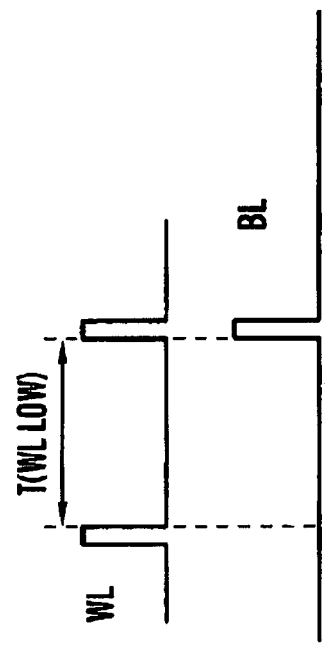

FIG. 7 shows the experimentally measured dependence of V(EQU) at three different T3 lengths. In the structure measured, the BL and WL applied voltage is 6V, and the measured V(EQU) is, as expected, in the range of 10–70 mV, when V(tester)>V(NC). The WL voltage is ramped up to 3 V. As expected, V(EQU) decreases with T(WL Low) delay time (FIG. 7B). The rate of V(EQU) is proportional to the rate of V(NC) change due to the NC leakage mechanisms.

TEST 2

MOSFET Charge Transfer Measurement by Pulsed Test

Since it is not possible to independently bias BS when WL is low, typical DC MOSFET parameter characterization of the charge transfer transistor is very limited in a product type structure having a single BL, WL, and a non-accessible BS in WL low condition. Therefore, there is provided a "pulsed test" method that quantifies the rate of charge transfer between BL and BS (NC) in a product-type cell using the inventive circuit.

Two possible test conditions can be applied to characterize the charge transfer from BS to BL and from BL to BS, respectively.

Measurement of Charge Transfer from BL to BS

Figure 8:
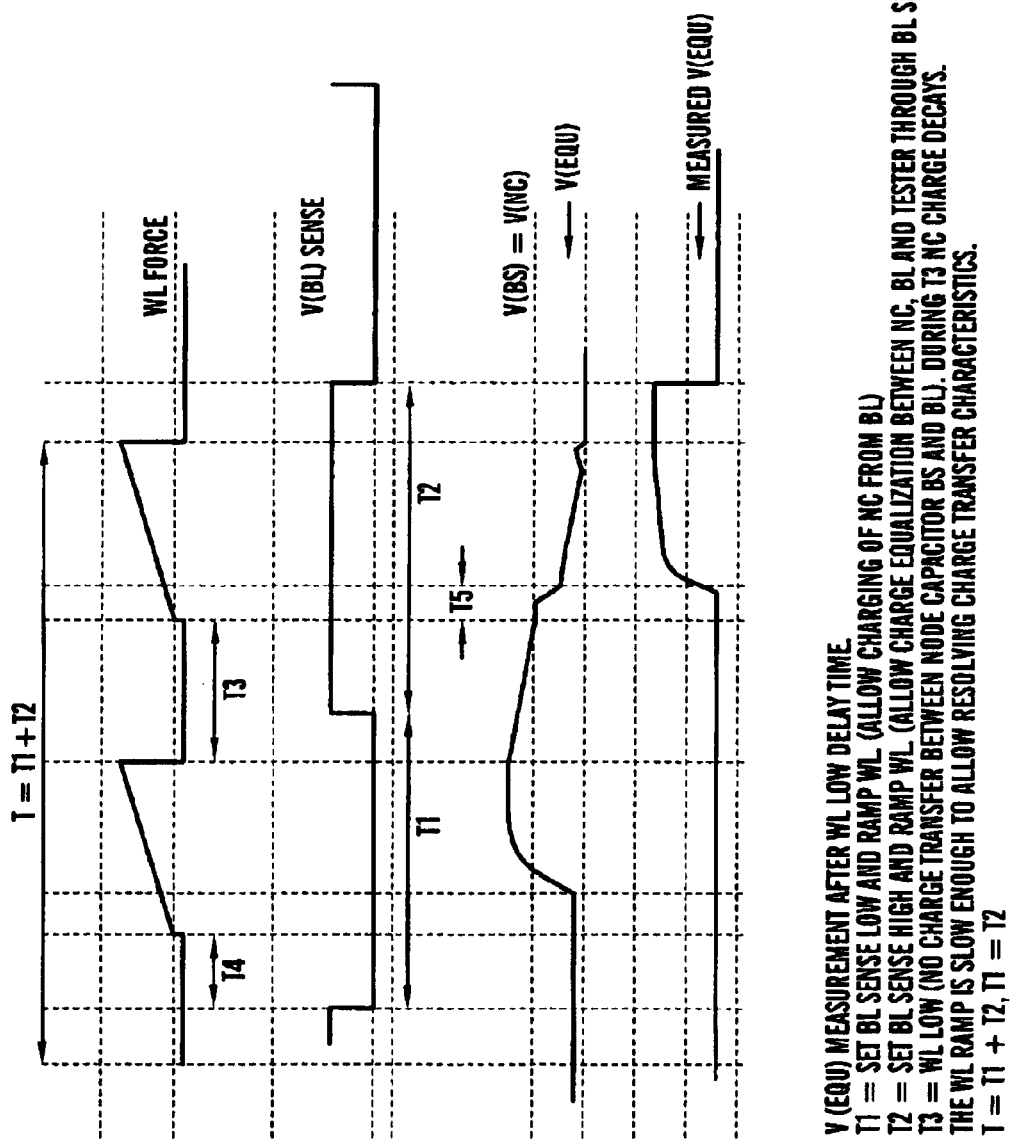
FIG. 8 illustrates V(EQU) measurement after a WL delay time.

The steps for measuring the charge transfer between BL and BS will be explained with reference to FIG. 8. Measure Ts.c from Test 1 with V(BL) and temperature value of interest. Set the BL Voltage and the temperature of interest. Run test as in FIG. 8 where T(WL Low)=T3<<Ts.c and WL ramp rate is low enough to resolve V(EQU) as a function of T(WL RAMP) rate. During T5, no charge transfer takes place since V(WL)<Vth. FIG. 8 shows the measured V(EQU) during T(WL RAMP).

Figure 9B:
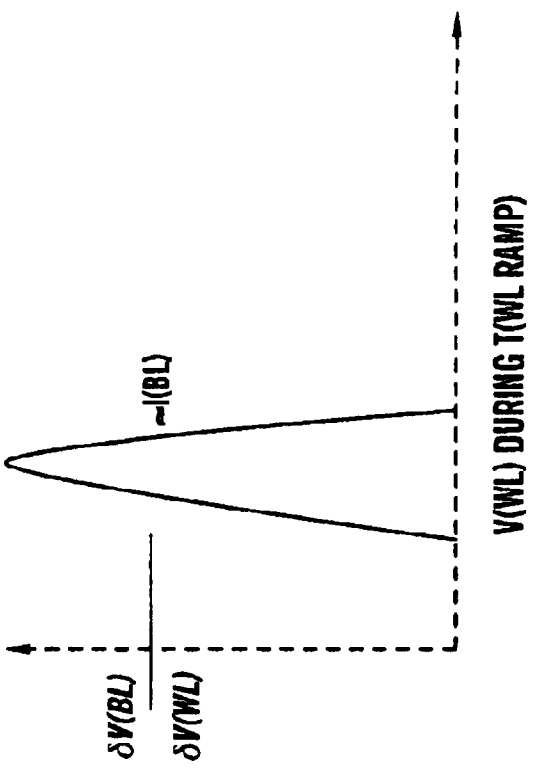
FIG. 9 shows the measured V(EQU) as a function of an applied V(WL).
Figure 9A:
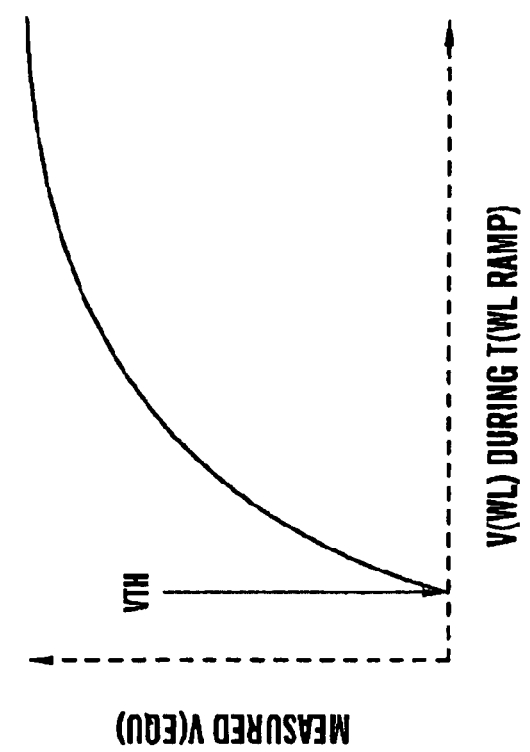

FIG. 9A shows the measured V(EQU) versus the applied V(WL) during a slow WL ramp, as described in FIG. 7. The derivative of V(EQU) with respect to V(WL) as a function of WL ramp is proportional to current I=I(BL) measured during the charge transfer.

$$\frac{dV(EQU)}{dV(WL)} = \frac{1}{R \times C(\text{Tester})} \times I$$

wherein C(Tester) is the tester capacitance, R is the WL ramp rate (V(WL))=R×t.

FIG. 9B shows the expected trend. An equivalent set of measurements is run to evaluate the BS to BL charge transfer.

Test 1 and test 2 methodologies in conjunction with the circuit illustrated in FIG. 3 can be implemented in production type array cells, where each of the cells can be individually probed. The estimate of Ts.c with V(EQU) can be correlated to the cell retention time. This implies that this technique allows to estimate the cell retention time without running any product type of stress. This pulse test methodology becomes critical in the development of the one transistor cell design.

Application of Proposed Circuit and Testing Methodology to Investigate Charge Transfer Device Wearout Mechanisms Accelerated Constant Voltage (DC) stresses are typically used to investigate transistor wearout and their impact on its EOL lifetime. The possibility of investigating the transfer device wearout by DC stresses requires modifications to the DRAM cell in such a way that the BS junction can be directly accessed during the stress.

Contacting BS is not possible during operation. In addition, it is not recommended for the following reasons. Probing BS directly can modify the cell environment to the extent that the new structure will have a different level of sensitivity to the device damage. Probing BS directly introduces added process complexity, which increases the development and manufacturing cost.

The invention provides a pulsed transfer device aging approach that takes advantage of the condition that BS can be constant for a stress time Tstress<Ts.c at a given V(BS), while WL is low. The DRAM cell using an NMOSFET transfer device is shown for illustrative purposes only. This stress method can be applied to investigate the MOSFET degradation of any MOSFET with a Capacitor in series in a real world operation.

Description of Pulsed Hot Carrier (HC) Aging

With reference to the circuit illustrated in FIG. 3, an estimate Ts.c (stress) of the one transistor cell at V(BL) stress voltage and temperature of interest using test 1 is provided. Pulse stresses are applied to BL and WL in order to transfer a given voltage to NC, and to activate the given stress configuration of interest. For any of the pulse stress configurations, T(WL Low)<Ts.c. under the stated conditions, V(NC)=V(BS) remains unchanged during T(WL Low). Set BL Sense circuit is switched to low during stress to isolate the cell under stress from the testing circuit. A BL stress voltage is applied to BL force node (2) of FIG. 3.

Additionally, the effect of the degradation experienced by the transfer device is estimated during the applied pulsed stress by monitoring its shift during charge transfer capability when applying test 2 under the stated conditions. Two possible "production like" transfer device aging modes are of interest: Aging during transfer of charge between BL and BS and aging having WL Low (Gate Off). Possible pulse stress configurations to investigate these two device aging mechanisms follow.

Transfer Device Aging During Transfer of Charge Between BL and BS

This type of aging phenomena is related to activating the MOSFET wearout mechanisms during the charge transfer. Channel conducting hot carriers are expected to degrade the device during the transients associated with the charge transfer. In this case, possible HC damage occurs at the junction with high-applied voltage. The following two pulsed stress configurations are used to investigate possible channel conducting HC damage in either or both BS and BL junctions.

1) Vertical Device Aging During Transfer of Charge from (BL to BS) or (BS to BL)

Figure 10:
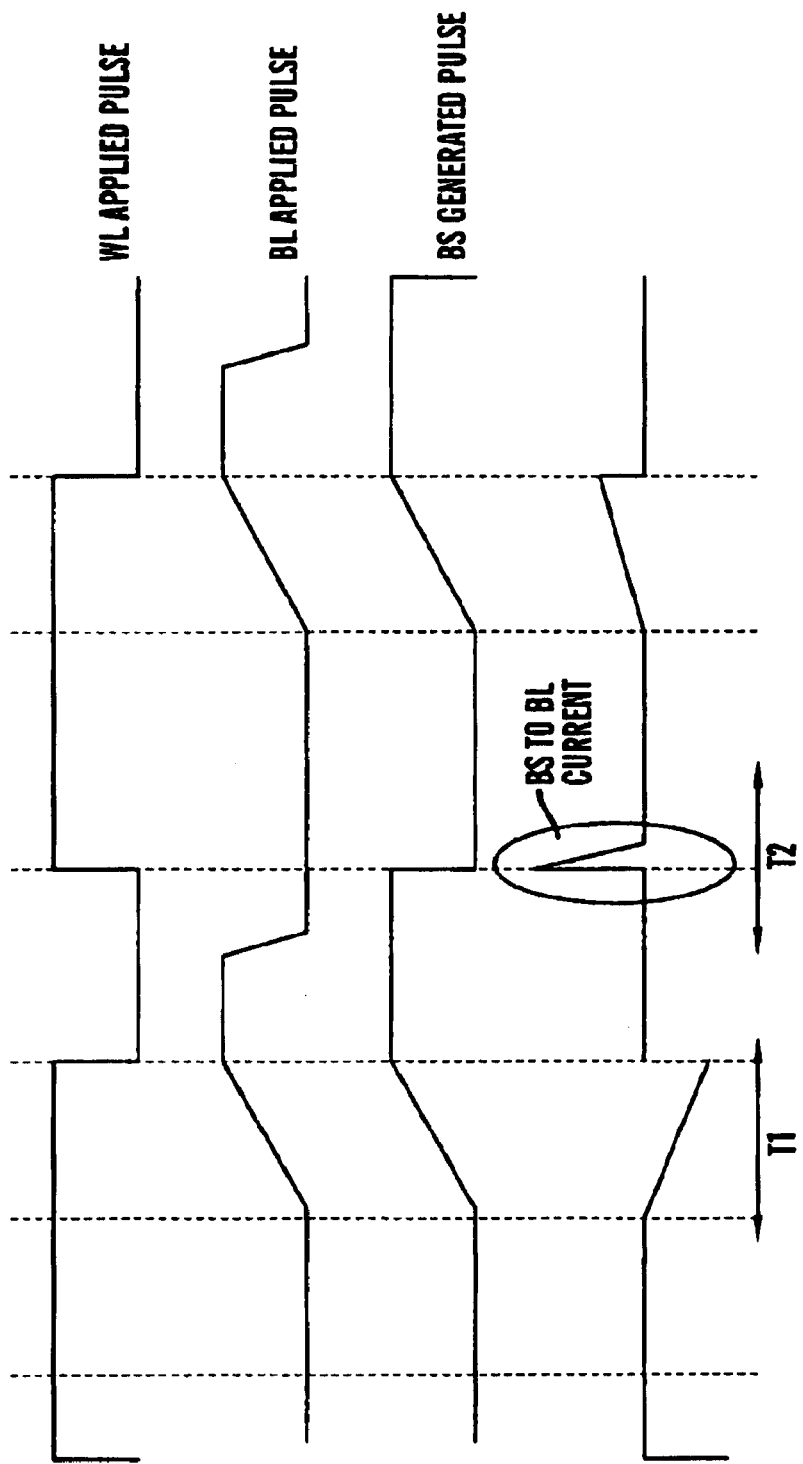
FIGS. 10–13 illustrate pulse stress sequences applied to WL and BL.

With reference to FIG. 10, there is shown a pulse configuration that creates aging at the transfer NMOSFET due to charge transfer (electron) from BL to BS. The charge transfer takes place during transient T2. During this interval, WL is pulsed from low to high with BL low, while BS follows BL from high to low. For a very short time during the transient, a condition of HC injection takes place. A slow ramping pulse is applied during the period T1 with WL high to set BS high before HC transient. During T1, charge transfer from BS to BL occurs, but no HC damage takes place since WL is high (no peak Isx condition). Obviously, T(WL Low)<<Ts.c at stress. Similar stress with charge transfer from BS to BL takes place if V(BL) low and high are swapped relative to (BL to BS) transfer.

2) Vertical Device aging during transfer of charge between BL and BS

Figure 11:
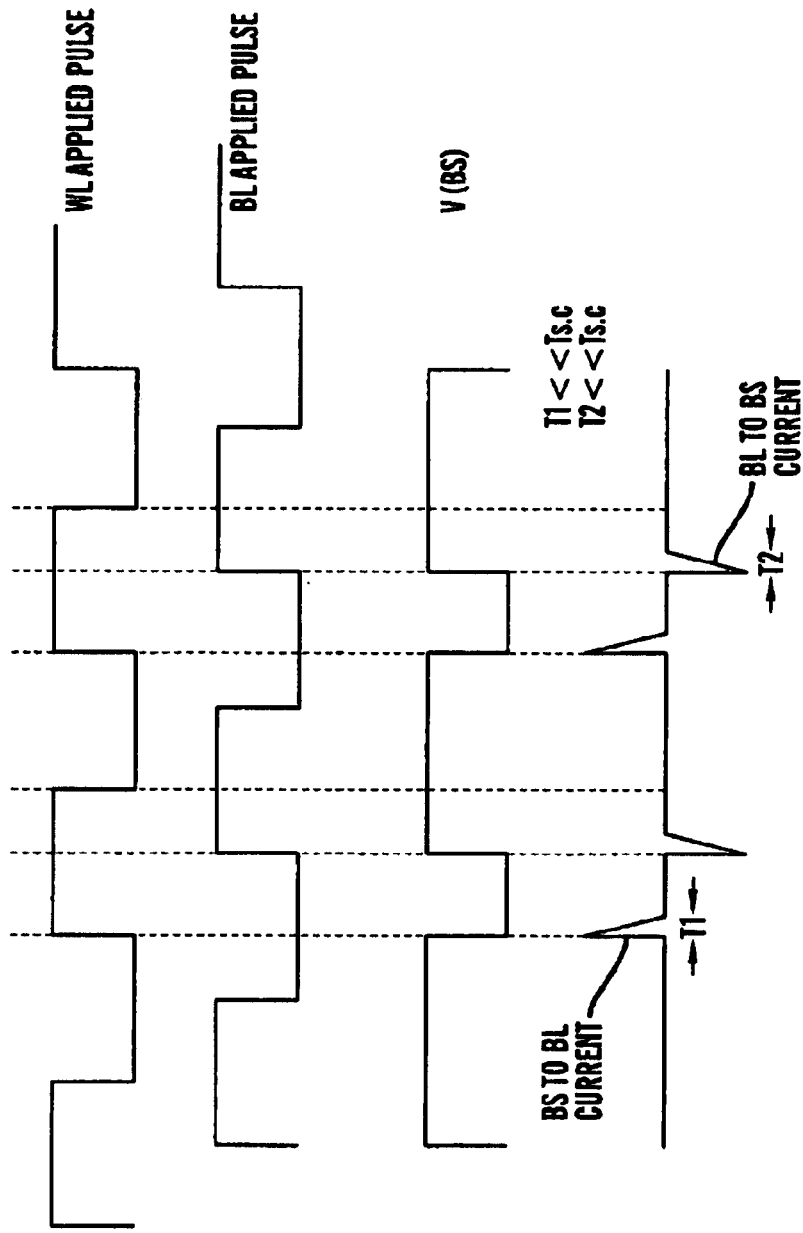

With reference to FIG. 11, there is shown a pulse configuration that creates transfer device aging due to charge transfer between BS and BL. The charge transfer takes place during transient T1 (BS to BL) and T2 (BL to BS). For a very short period of time during the transient, a condition of HC injection takes place. With this type of pulsed stress, the device degradation due to HC damage in both BS and BL is experienced. Obviously, T(WL Low)<<Ts.c, at stress.

Charge Transfer Device Aging During WL LOW

This type of aging phenomena relates to activating the MOSFET wearout during WL Low condition (when no charge transfer occurs). The channel non-conducting Hot Carrier mechanism is one of the mechanisms expected to degrade the device. The non-conducting HC damage occurs at the junction with high voltage. In addition, possible LITS (Leakage Induced Threshold Shift) is activated when both BS and WL are high and WL low. The following three pulsed stress configurations can be used to investigate possible WL low wearouts in either or both BS and BL junctions. In all stress conditions T(WL Low)<<Ts.c. For these stress configurations, Set BL Sense voltage is at low, isolating the sensing circuit (FIG. 3). In addition, BL low and high are respectively set by applying high and low at BL force Node (2).

1) WL Low/(BS High/BL Low) or (BS Low/ BL High)

Figure 12:
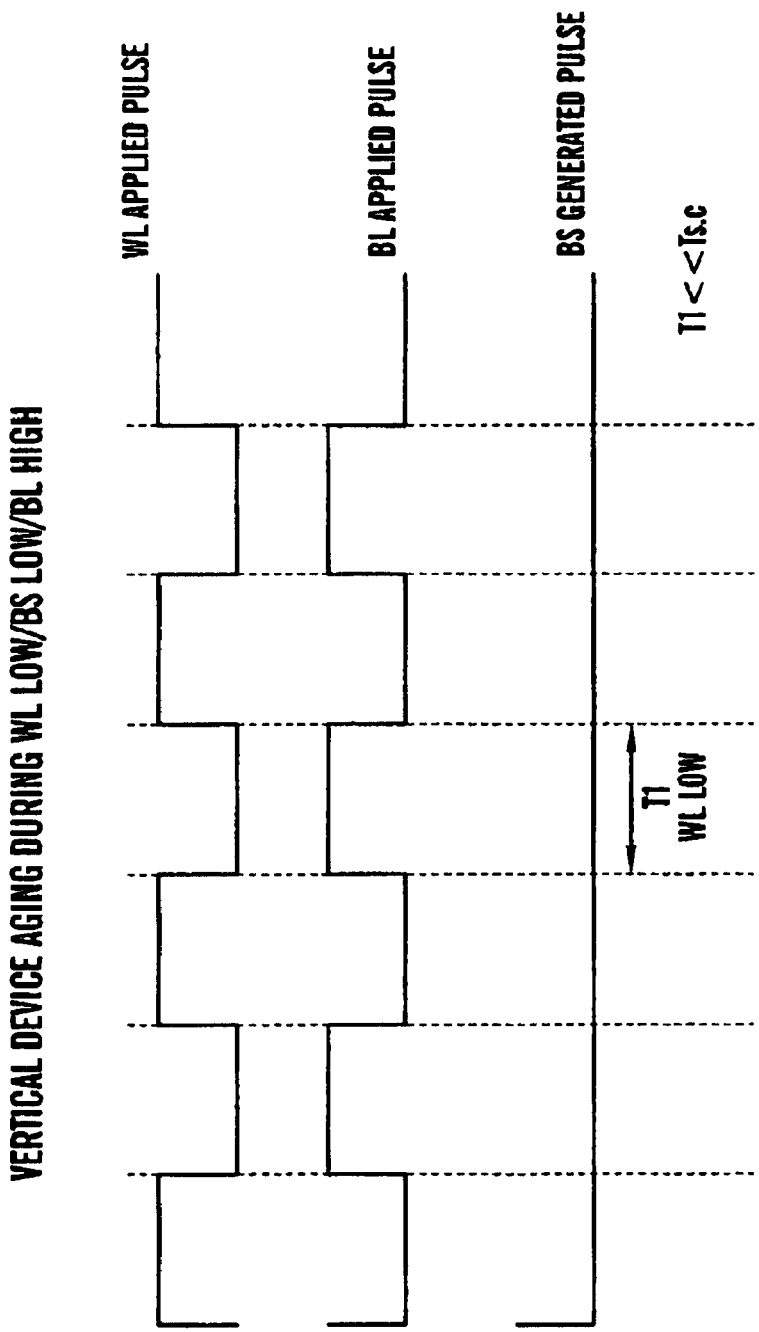

With reference to FIG. 12, there is shown a pulse configuration that generates transfer device aging during WL low with BS high and BL low (during T1). During T1, (an off condition) conducting HC injection takes place (BS= drain). A stress configuration with BS low and BL high is achieved by swapping BL voltage relative to FIG. 11. Aging is the result of the non-conducting HC damage during the WL low regime.

2) WL Low/BL and BS High

Figure 13:
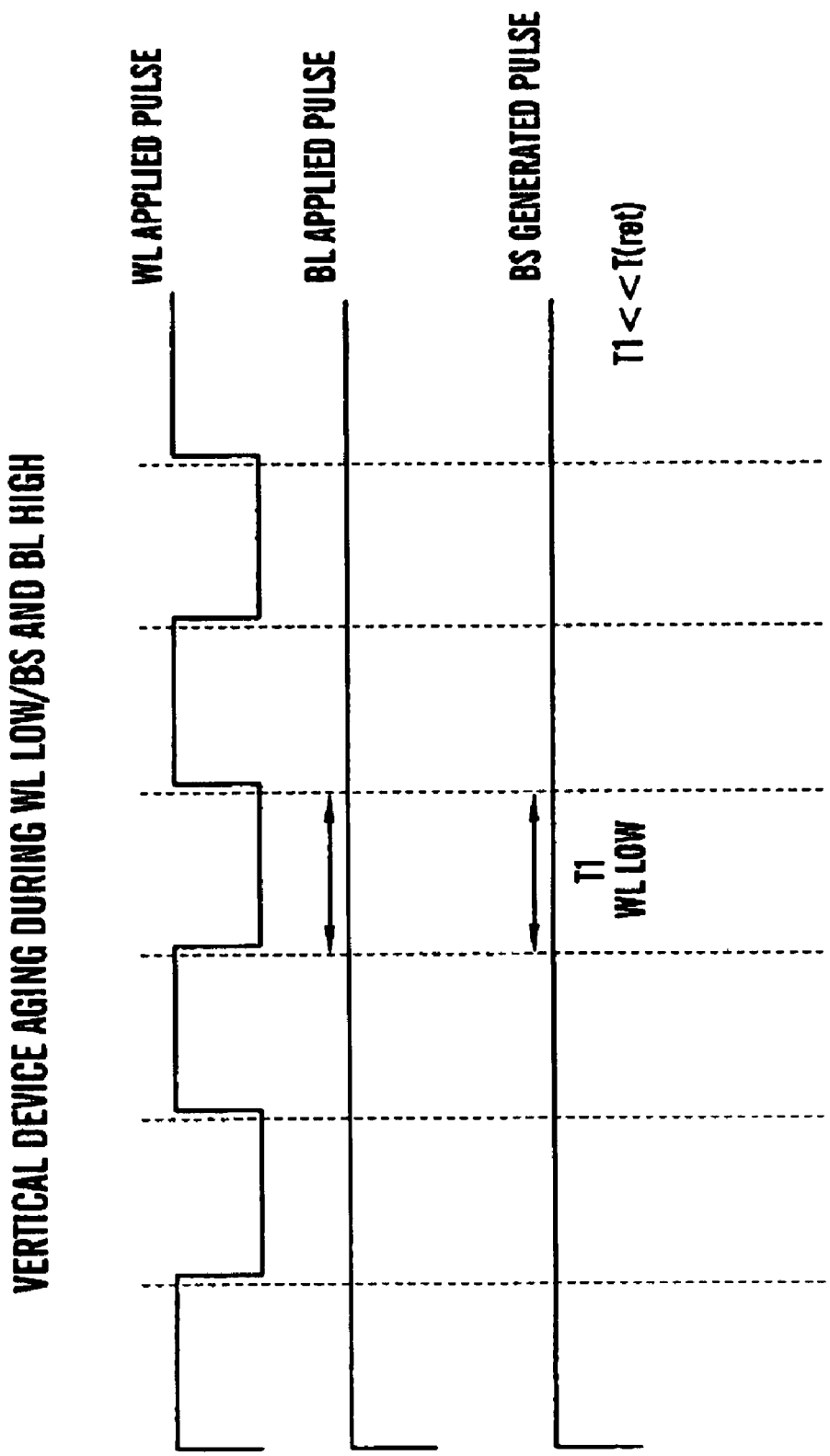

With reference to FIG. 13, there is shown a pulse configuration that creates transfer device aging due to WL, low with BL and BS high (during T1) simultaneously. During T1, a condition of LITS injection takes place. Aging is the result of the LITS HC damage during the WL low regime.

Figure 14A:
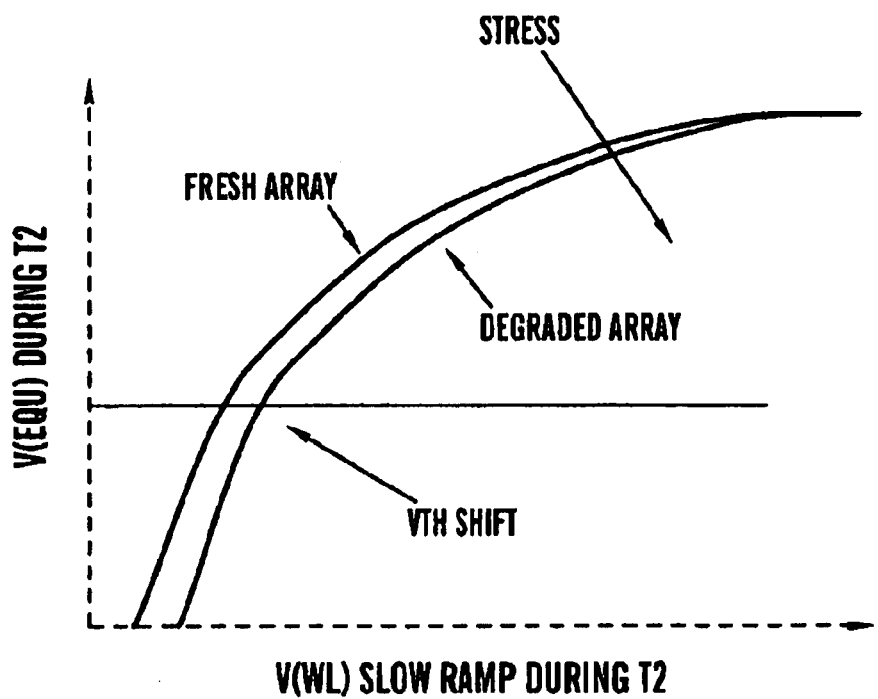
FIG. 14 illustrates the expected shift of V(EQU) vs. V(WL ramp) characteristics.
Figure 14B:
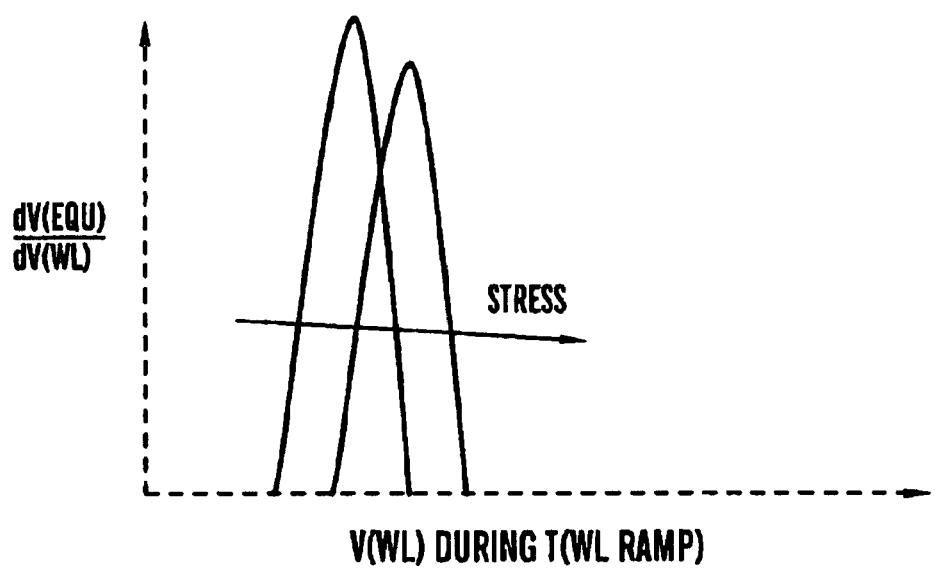

With reference to FIG. 14, during the stress run at the bias configurations given above, a different readout needs to be taken to measure the degradation of the charge transfer capability, as illustrated in FIG. 14(A) that shows the expected shift of V(EQU) vs. V(WL Ramp) of the pulsed stress during Test 2. The expected shift is shown in FIG. 14(B) depicting the expected shift of $$\frac{\partial V(EQU)}{\partial V(WL)} Vs\ V\ (WL\ \text{ramp})$$

characteristics as a function of the pulse stressed during Test 2.

Figure 15:
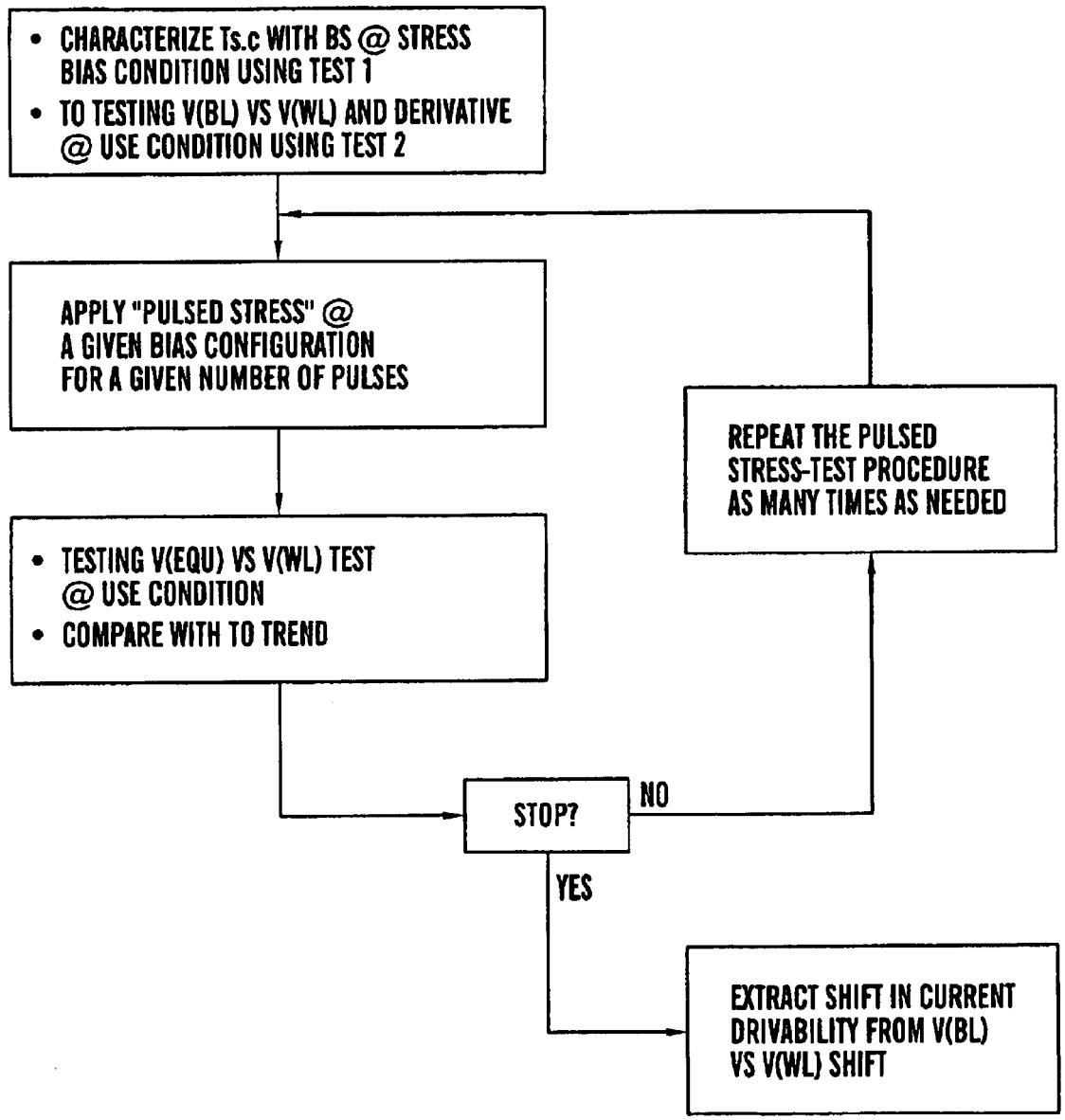
FIG. 15 illustrates a stressing/testing procedure flowchart.

FIG. 15 illustrates a flow chart of the present test/stress method. By changing the height of WL and BL pulses, a different stress voltage is applied to each bias stress configuration. This feature allows a testing regime that establishes the voltage activation of a given wearout mechanism that the transfer device is sensitive to. Since the pulse of the stress is shorter than Ts.c, the stress in question takes place with BS and NC at a controlled applied voltage. No other mechanisms, different from those under investigation, are expected to be activated at the same time.

This approach allows lifetime projections for a device wearout. Other pulse shapes can be used to investigate other possible wearout mechanisms as well as to modulate the duty cycle as desired. The "pulsed stress" configurations described herein are provided by external pulse generators together with clocks or on-chip ring oscillators whose period is smaller than the retention time of the storage cell. These generators and clocks are well known articles of commerce and are not described herein. Similarly, the tester used for measuring voltages output from the DRAM cell are also well know articles of commerce and their specific use is not considered part of the invention described herein, thus, these devices are not described.

In further testing embodiments, random chips can be taken off an assembly line, each having the inventive circuit incorporated therein, and tested. A version of the invention can be fabricated in the chip kerf and run therefrom. A multiplexer can test a given range of cells. Strategically located cells can be selected for testing, and if they are all within a given tolerance it is known that one has a good chip. Dedicated package pins may be needed in these instances to activate the device.

Whereas the present invention has been described with respect to the foregoing embodiments, it is needless to say that various changes and modifications can be made without departing from the subject matter of the present invention, all of which fall within the scope and spirit of the appended claims.

What is claimed is:

1. An apparatus for measuring the transfer characteristics of a charge transfer device and the charge holding capability of a capacitor wherein said charge transfer device and said capacitor are integral to a memory cell, the apparatus comprising:

a memory array consisting of a plurality of said memory cells arranged in a matrix formation, wherein at least one of said memory cells is coupled to a bitline and to a wordline;

a circuit having two inputs, wherein by applying a constant voltage to the first input of said circuit and by applying a voltage pulse to the second input of said circuit, electrical charge is transferred via a corresponding bitline coupled to the capacitor of said at least one memory cell when a corresponding wordline coupled to said at least one memory cell is activated; and a voltage amplifier for amplifying the voltage in said capacitor and for enabling a transfer of said amplified voltage to a means for performing an analog measurement.

2. The apparatus of claim 1, wherein said circuit includes a common input/output line (I/O) coupled to said at least one memory cell, wherein when said common I/O acts as an input, said means for performing an analog measurement is disconnected, enabling a charge transfer from said bitline to said capacitor, and when said I/O acts as an output, said corresponding bitline is disconnected, enabling said analog measurement.

3. The apparatus of claim 1, wherein said circuit is comprised of first and second passgate transistors coupled to a common I/O line.

4. The apparatus of claim 3, wherein said circuit further comprises an inverter to enable a complementary operation of said first and second passgates.

5. The apparatus recited in claim 4, wherein said circuit comprises a third passgate to inhibit a signal applied to said second input from being measured by said measuring means.

6. The apparatus of claim 1, wherein said amplifier is positioned on-chip.

7. The apparatus of claim 1 wherein the circuit comprises a bit line logic node and a logic circuit, wherein the logic circuit includes a pair of passgates both coupled to the bit line logic node for alternatively blocking the test voltage signals to the one memory cell of the memory cell array while permitting transmitting from the one memory cell the scaled memory cell voltage level and permitting the test voltage signals to the one memory cell of the memory cell array while blocking the transmitting from the one memory cell the scaled memory cell voltage level.

8. The apparatus of claim 7 wherein the logic circuit further includes a first input node and a second input node, the first input node for receiving a selection signal that selects either of said alternatively blocking the test voltage signals while permitting transmitting from the one memory cell or permitting the test voltage signals while blocking the transmitting from the one memory cell, the second input node for receiving one of said test voltage signals for transmitting to the one memory cell of the memory cell array.

9. A method for determining a charge retention performance of a memory cell, the method comprising the steps of:

electrically coupling a constant voltage source having a voltage level to the memory cell;

electrically connecting a first blocking device (PG3) and a second blocking device (WL transistor) between the constant voltage source and the memory cell;

opening the first blocking device and the second blocking device including allowing charge transfer from the constant voltage source to charge the memory cell;

closing the first and second blocking devices including preventing the charge transfer to the memory cell and determining a time duration during which the second blocking device is closed;

opening the second blocking device while keeping closed the first blocking device including measuring a scaled voltage level of the memory cell; and calculating a charge retention performance level of the memory cell based on the voltage level of the voltage source, the measured scaled voltage level of the memory cell, and the time duration.

10. The method of claim 9, wherein the calculating step includes the step of calculating a charge retention time.

11. A method for measuring the transfer characteristics of a charge transfer device and the charge holding capability of a capacitor wherein the charge transfer device and the capacitor are integral to a memory cell, the method steps comprising:

providing a memory array consisting of a plurality of said memory cells arranged in a matrix formation, wherein at least one of said memory cells is coupled to a bitline and to a wordline;

providing a circuit having two inputs, wherein by applying a constant voltage to the first input of said circuit and by applying a voltage pulse to the second input of said circuit, electrical charge is transferred via a corresponding bitline coupled to the capacitor of said at least one memory cell when the corresponding wordline coupled to said at least on memory cell is activated; and providing an on-chip voltage amplifier for amplifying the voltage in said capacitor and for enabling the transfer of said amplified voltage to a means for performing an analog measurement.

12. The method of claim 11, wherein said circuit is further comprised of:

means for applying a voltage and holding a charge in said capacitor without allowing for a charge transfer to occur;

means for transferring the charge stored in said capacitor while activating said transfer device when said wordline is energized and said bitline is disconnected; and means for measuring the voltage in said capacitor to be provided to a measuring means.

13. The method of claim 12, wherein said on-chip voltage amplifier amplifies an equalized bitline and capacitor voltage when said bitline is disconnected.

14. The method of claim 13 wherein voltage signals are independently applied to said wordline and said first and second inputs to monitor the charging of said capacitor and said transfer characteristics.

15. The method of claim 12, wherein said charge transfer device and said capacitor are connected in series for monitoring and stressing the charge transfer characteristics of said charge transfer device operating in a product like environment.

16. The method of claim 15, wherein said charge transfer device and said capacitor are connected in series and independently monitor the discharging characteristics of said capacitor and the transfer characteristics of said charge transfer device.

17. The method of claim 12, wherein said measuring means is a tester.

* * * * *